(12) United States Patent
Tang et al.

(10) Patent No.: US 11,777,057 B2
(45) Date of Patent: Oct. 3, 2023

(54) SPHERICAL LED CHIP, METHOD FOR MANUFACTURING THE SAME, DISPLAY PANEL, AND METHOD FOR SPHERICAL LED CHIP TRANSFER

(71) Applicant: CHONGQING KONKA PHOTOELECTRIC TECHNOLOGY RESEARCH INSTITUTE CO., LTD., Chongqing (CN)

(72) Inventors: Biao Tang, Chongqing (CN); Haiping Liu, Chongqing (CN); Zhongshan Feng, Chongqing (CN)

(73) Assignee: CHONGQING KONKA PHOTOELECTRIC TECHNOLOGY RESEARCH INSTITUTE CO., LTD., Chongqing (CN)

( * ) Notice: Subject to any disclaimer, the term of this patent is extended or adjusted under 35 U.S.C. 154(b) by 116 days.

(21) Appl. No.: 17/203,273

(22) Filed: Mar. 16, 2021

(65) Prior Publication Data

US 2021/0296532 A1  Sep. 23, 2021

(30) Foreign Application Priority Data

Mar. 23, 2020 (CN) .......................... 202010211503.9

(51) Int. Cl.
*H01L 33/20* (2010.01)
*H01L 33/24* (2010.01)
*H01L 33/00* (2010.01)
*H01L 33/40* (2010.01)

(52) U.S. Cl.
CPC .......... *H01L 33/24* (2013.01); *H01L 33/0095* (2013.01); *H01L 33/40* (2013.01); *H01L 2933/0016* (2013.01)

(58) Field of Classification Search
CPC ...................................................... H01L 33/20
USPC ............................................................ 257/99
See application file for complete search history.

(56) References Cited

U.S. PATENT DOCUMENTS 6,204,545 B1 * 3/2001 Nakata ............. H01L 29/66136
257/466

FOREIGN PATENT DOCUMENTS

| CN | 1582502 | A | 2/2005 |
| CN | 104733584 | A | 6/2015 |
| CN | 110611018 | A | 12/2019 |
| CN | 211125685 | U | 7/2020 |
| CN | 111540815 | A | 8/2020 |
| CN | 111540819 | A | 8/2020 |

(Continued)

OTHER PUBLICATIONS

Machine translation of Tang et al., CN211125685. (Year: 2020).*

(Continued)

*Primary Examiner* — Hsin Yi Hsieh
(74) *Attorney, Agent, or Firm* — HAUPTMAN HAM, LLP

(57) ABSTRACT

A spherical LED chip, a method for manufacturing the same, and a display panel, and a method for spherical LED chip transfer are provided. The spherical LED chip includes a first electrode, a second electrode surrounding the first electrode and having magnetism, and a first insulating protective layer arranged at the outside of the first electrode. The first insulating protective layer and the second electrode form an LED housing configured to wrap the first electrode and with a spherical outer contour.

15 Claims, 11 Drawing Sheets

(56) References Cited

FOREIGN PATENT DOCUMENTS

CN   211350681 U   8/2020
KR   20120057169 A   6/2012

OTHER PUBLICATIONS

International Search Report issued in corresponding International Application No. PCT/CN2020/113524, dated Dec. 28, 2020, pp. 1-10, Beijing, China.

* cited by examiner

SPHERICAL LED CHIP, METHOD FOR MANUFACTURING THE SAME, DISPLAY PANEL, AND METHOD FOR SPHERICAL LED CHIP TRANSFER

CROSS-REFERENCE TO RELATED APPLICATION(S)

This application claims priority to Chinese Patent Application No. 202010211503.9, filed on Mar. 23, 2020, the entire disclosure of which is hereby incorporated by reference.

TECHNICAL FIELD

The present application relates to the field of display devices, and in particular to a spherical light-emitting diode (LED) chip, a method for manufacturing the same, a display panel, and a method for spherical LED chip transfer.

BACKGROUND

Micro-LED is a new generation of display technology. Compared with related liquid-crystal displays, it has higher photoelectric efficiency, higher brightness, higher contrast, and lower power consumption, and it can also be combined with a flexible panel to realize a flexible display. The micro-LED has the same light-emitting principle as a traditional LED chip. However, the size of a single LED chip is less than 20 μm, which greatly increases the difficulty of its preparation. During preparation, mass transfer technology is critical. At present, the mass transfer technology mainly includes electrostatic transfer, micro-printing, and fluid assembly.

The mass transfer technology aims to assemble a single small LED chip on a substrate to form an LED display panel. A related fluid assembly process includes the following steps. A bucket on a substrate is rolled, so that a LED chip is placed in a liquid suspension. The LED chip will arrive at a corresponding position at the substrate via fluid force. However, a traditional LED chip is usually cuboid or cylindrical. The orientation of a cuboid or cylindrical LED chip is not easy to be adjusted via fluid force due to its straight edges or corners. When reaching the corresponding position at the substrate, the cuboid or cylindrical LED chip cannot be accurately aligned. Therefore, it is difficult to achieve accurate mass transfer for a cuboid or cylindrical LED chip, which affects the assembly efficiency.

Therefore, the related art needs to be improved and developed.

SUMMARY

According to a first aspect, a spherical LED chip is provided, which includes a first electrode, a second electrode surrounding the first electrode and having magnetism, and a first insulating protective layer arranged at the outside of the first electrode. The first insulating protective layer and the second electrode form an LED housing configured to wrap the first electrode and with a spherical outer contour.

Further, the first electrode is arranged along the central axis of the spherical outer contour, and a second insulating protective layer is arranged between the first electrode and the second electrode.

Further, the orthographic projection of the second electrode on a plane perpendicular to the central axis where the first electrode is located is a ring.

Further, the ring is a polygonal ring or a circular ring.

Further, the spherical LED chip includes a first semiconductor layer, a luminescent layer, and a second semiconductor layer sequentially located in a cavity of the LED housing, where the first semiconductor layer is in contact with the first electrode, and the second semiconductor layer is in contact with the second electrode.

Further, the second insulating protective layer is extended between the first electrode and the luminescent layer and between the first electrode and the second semiconductor layer.

According to a second aspect, a display panel is provided, which includes a back plate, multiple spherical light-emitting diode (LED) chips of the first aspect arranged on the back plate, a first metal pad arranged on the back plate and configured to be connected with the first electrode, and a second metal pad arranged on the back plate and configured to be connected with the second electrode, where the second metal pad has magnetism opposite to that of the second electrode.

Further, the back plate defines multiple grooves, where each of the multiple grooves is configured to accommodate one spherical LED chip.

Further, the second electrode is set to be of different patterns according to different colors of pixels, and the second metal pad is set to be of a pattern matched with the second electrode.

According to a third aspect, a method for manufacturing a spherical LED chip is provided, which includes the following steps.

An epitaxial layer is formed on a substrate, where the epitaxial layer includes a first semiconductor layer, a luminescent layer, and a second semiconductor layer sequentially superimposed from bottom to top.

The epitaxial layer is etched, via a dry etching process, to form a first hemisphere. The first hemisphere is etched, via the dry etching process, to define a first electrode hole.

An insulating protective layer is deposited.

The insulating protective layer is etched to form a second electrode position.

A first electrode is plated in the first electrode hole, and a second electrode having magnetism is plated at the second electrode position.

The substrate is peeled off, and one side of the epitaxial layer facing the substrate is etched, via the dry etching process, to form a second hemisphere.

An insulating protective layer is deposited on the second hemisphere.

According to a fourth aspect, a method for spherical light-emitting diode (LED) chip transfer is provided, which includes the following steps.

Multiple spherical LEDs of the first aspect is placed in a suspension.

A back plate is placed in the suspension to make the multiple spherical LEDs float above the back plate, where the back plate defines multiple grooves, a second metal pad is arranged on the back plate, and the second metal pad has magnetism opposite to that of the second electrode.

The multiple spherical LEDs are transferred, via magnetism between the second electrode and the second metal pad, onto the multiple grooves of the back plate.

Reference numbers in the figures are as follow: 100 spherical LED chip; 110 first electrode; 120 second electrode; 130 first insulating protective layer; 140 second insulating protective layer; 150 first semiconductor layer; 151 luminescent layer; 152 second semiconductor layer; 200 back plate; 210 first metal pad; 220 second metal pad; 230 groove; 300 substrate; 310 first hemisphere; 320 first electrode hole; 330 second electrode position; 340 second hemisphere; 350 bonding material; 360 bonding substrate; 370 insulating protective layer.

DETAILED DESCRIPTION

The present application provides a spherical light-emitting diode (LED) chip, a method for manufacturing the same, a display panel, and a method for spherical LED chip transfer. In order to make the objectives, technical solutions, and effects of the present application clearer, the present application will be further described in detail with reference to the accompanying drawings and examples. It should be understood that the embodiments described herein are only used to explain but not to limit the present application.

Figure 1:
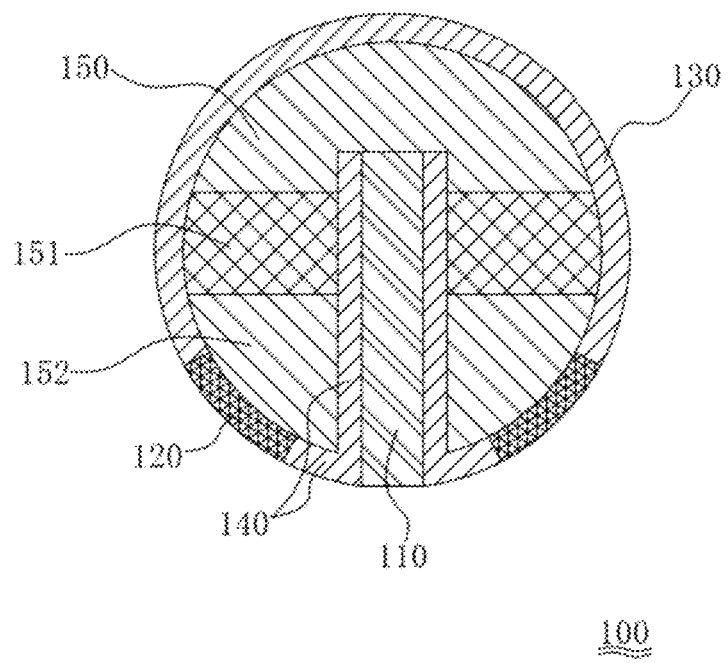
FIG. 1 is a cross-sectional view of a spherical LED chip according to an embodiment of the present application.

FIG. 1 shows a spherical LED chip. The spherical LED chip includes a first electrode 110 and a second electrode 120 surrounding the first electrode 110. The first electrode 110 and the second electrode 120 are arranged at a distance. The second electrode 120 has magnetism, such that the LED chip can be adsorbed to a back plate during mass transfer such as fluid assembly. A first insulating protective layer 130 is arranged at the outside of the first electrode 110. The first insulating protective layer 130 and the second electrode 120 form an LED housing. The LED housing has a spherical outer contour and is configured to wrap the first electrode 110. That is, the LED housing defines an inner cavity in which the first electrode 110 is located. In an example, the outer contour of the LED housing is hemispherical. The LED housing also serves as the light-emitting surface of the LED chip to guide light for the LED chip. The outer contour of the LED housing may be hemispherical. The outer contour of the LED housing may also be spherical. In this case, the bottom surface of the first electrode is set to be flat. Alternatively, the bottom surface of the first electrode and the top surface opposite to the bottom surface are both flat. Alternatively, the left and right sides, relative to the first electrode, of the outer contour of the LED housing are set to be flat.

According to the present solution, the first insulating protective layer 130 and the second electrode 120 form the LED housing of the spherical LED chip. The spherical LED housing is configured to wrap the first electrode 110, and separate the first electrode 110 from the second electrode 120, thus realizing the power supply of the spherical LED chip. The LED chip is set to be spherical, so the light-emitting surface thereof will be a spherical surface. The spherical LED housing as the light-emitting surface helps to reduce the total reflection inside the LED chip, thereby improving a light extraction efficiency. A mounting position corresponding to the size of the spherical LED chip can be defined on a back plate. When the LED chip is transferred to the back plate via mass transfer such as the fluid assembly, the spherical LED housing is accurately positioned on the mounting position at the back plate via attractive magnetism of the second electrode 120. The spherical LED chip instead of a cuboid or cylindrical LED chip allows for smooth position adjustment, thus realizing accurate massive transfer.

Figure 2:
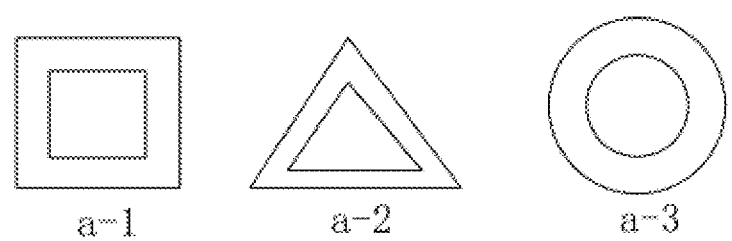
FIG. 2 is a schematic diagram of the orthographic projection of a second electrode of a spherical LED chip according to an embodiment of the present application.

As shown in FIG. 1, the structure of the spherical LED chip of the embodiment is as follows. The first electrode 110 is arranged along the central axis of the spherical outer contour of the LED housing. The first electrode 110 may be cylindrical, square pillar, or polygonal column. The bottom of the first electrode 110 is exposed at the bottom of the spherical outer contour of the LED housing. A second insulating protective layer 140 is arranged between the first electrode 110 and the second electrode 120. That is, a part from the second electrode 120 to the bottom of the first electrode 110 is served as the second insulating protective layer 140, which separates the first electrode 110 and the second electrode 120. The second insulating protective layer 140 and the second electrode 120 is served as a lower part of the spherical outer contour of the LED housing. The first insulating protective layer 130 is served as an upper part of the spherical outer contour of the LED housing. A surface area of the spherical outer contour of the LED housing occupied by the first insulating protective layer 130 can be adjusted based on actual design needs. In an example, the first electrode can also be arranged in parallel to and offset by a certain distance from the central axis of the spherical outer contour of the LED housing, which can also achieve the present solution. As shown in FIG. 2, on a plane perpendicular to the central axis where the first electrode 110 is located, the orthographic projection of the second insulating protective layer 140 is a ring, and the projection of bottom of the first electrode 110 is located in the middle of the ring. The second electrode(s) 120 has magnetism, so the outer surface of the LED housing is magnetic. In this way, when the LED chip is mounted via magnetism, the first electrode 110 can always be located at the center position and position adjustment can be achieved through attractive magnetism of the second electrode 120, achieving accurate positioning. The ring in the embodiment is a polygonal ring or a circular ring, such as a triangular ring (a-2 in FIG. 2), a quadrilateral ring (a-1 in FIG. 2), or a circular ring (a-3 in FIG. 2). The ring can also be other rings, such as a lace ring.

As shown in FIG. 1, the spherical LED chip also includes a first semiconductor layer 150, a luminescent layer 151, and a second semiconductor layer 152 sequentially located in a cavity of the LED housing. From bottom to top, there are the second semiconductor layer 152, the luminescent layer 151, and the first semiconductor layer 150. The first semiconductor layer 150 is in contact with the first electrode 110, and the second semiconductor layer 152 is in contact with the second electrode 120. In this way, conduction to the first semiconductor layer can be achieved via the first electrode 110, and conduction to the second semiconductor layer can be achieved via the second electrode 120, so that, under action of the second semiconductor layer 152 and the first semiconductor layer 150, the luminescent layer 151 can emit light.

The second insulating protective layer 140 is extended between the first electrode 110 and the luminescent layer 151 and between the first electrode 110 and the second semiconductor layer 152. In an example, the second insulating protective layer 140 is extended into the cavity of the LED housing and is attached to the outer wall of the first electrode 110. In this way, the first electrode 110 is separated from the second insulating protective layer 140, and the first electrode 110 is separated from the luminescent layer 151. The upper surface of the first electrode 110 is exposed to be connected with the first semiconductor layer 150 above. In this way, a complete spherical LED chip 100 is formed.

Figure 3:
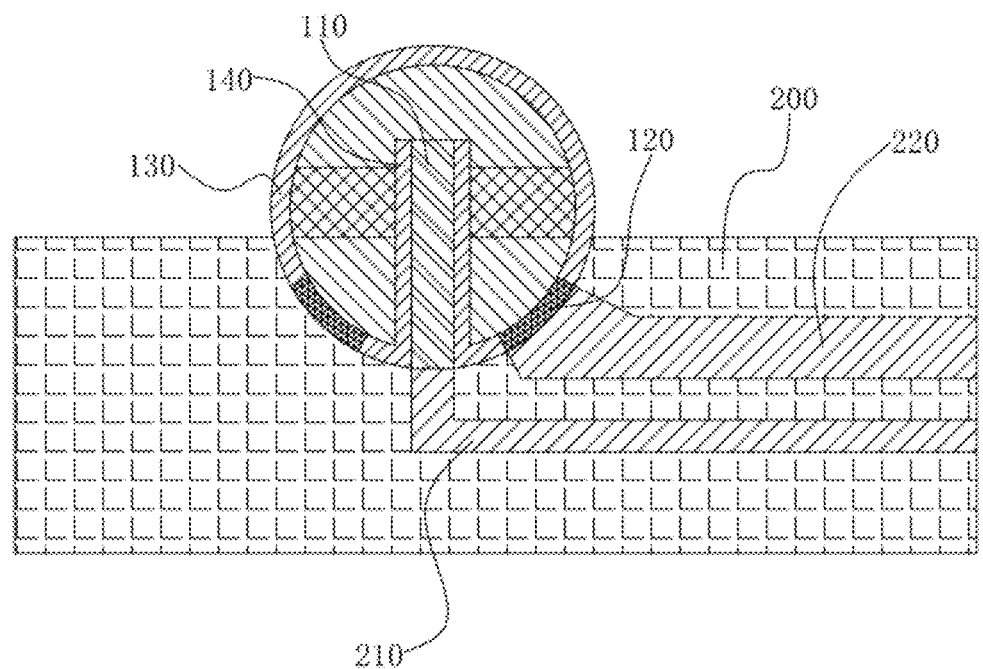
FIG. 3 is a cross-sectional view of a display panel according to an embodiment of the present application.

As shown in FIG. 3, the embodiment further provides a display panel. The display panel includes a back plate 200. Multiple spherical LED chips 100 as described above are fixedly arranged on the back plate 200. A first metal pad 210 is fixedly arranged on a mounting position of each LED chip on the back plate 200. The first metal pad 210 is configured to be connected with the first electrode 110 of the spherical LED chip 100. A second metal pad 220 is fixedly arranged on the mounting position of each LED chip on the back plate 200. The second metal pad 220 is configured to be connected with the second electrode 120. The second metal pad 220 has magnetism opposite to that of the second electrode 120. The first metal pad 210 and the second metal pad 220 are extended in the back plate 200 and configured to be connected with an external control circuit. The first metal pad 210 and the second metal pad 220 are spaced apart in the back plate 200.

Figure 4:
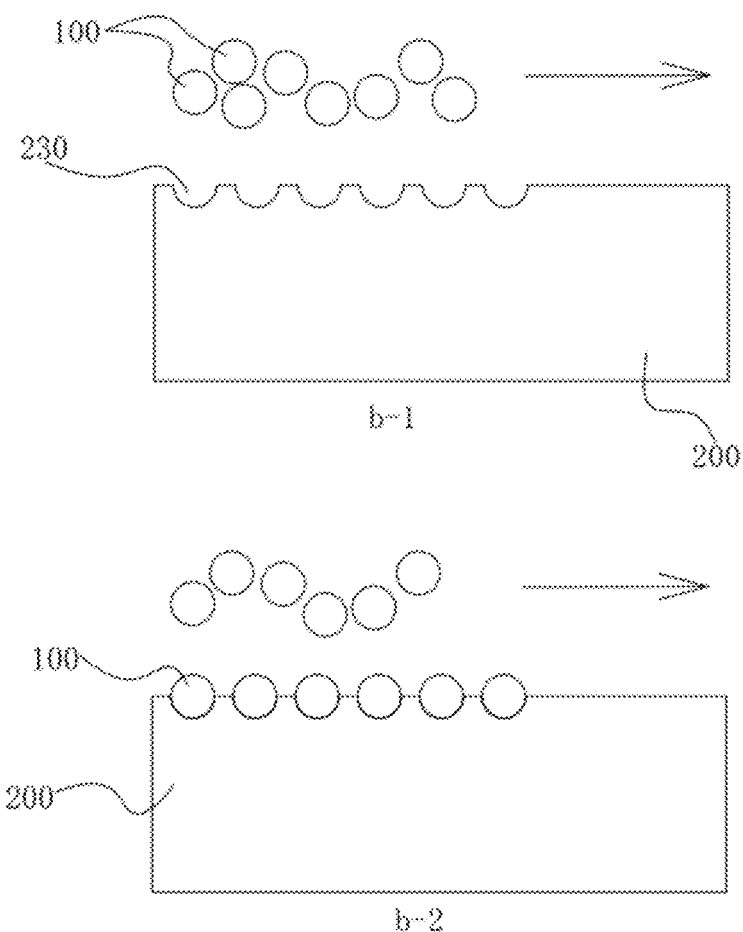
FIG. 4 is a schematic diagram of a mass transfer such as fluid assembly according to the present application.

As shown in FIG. 4, the die shrink process technology and the mass transfer technology are core processes of the Micro-LED transfer process. The die shrink process technology aims to miniaturize, array, and thin traditional LED crystal films. The mass transfer technology aims to transfer the miniaturized, arrayed LED crystal films onto a circuit board in batches. In the embodiment, micro-spherical LED chips smaller than 100 microns will be arranged in an array and then transferred onto a back plate in batches using mass transfer technology, for packaging to form a complete LED panel.

As shown in b-1 in FIG. 4, during the assembly and splicing of a display according to the present application, the multiple spherical LED chips 100 as described above are placed in a suspension. After the second metal pad 220 on the back plate 200 is powered on, the second metal pad 220 has a magnetism opposite to that of the second electrode 120. When the suspension is flowing, as shown in b-2 in FIG. 4, the second electrode 120 and the second metal pad 220 are attracted to each other via magnetism, so that the spherical LED chip 100 will be accurately aligned to the mounting position at the back plate 200. When the second electrode 120 of the spherical LED chip 100 in the suspension is attracted to the second metal pad 220, the position of the spherical LED chip 100 can be smoothly adjusted in the suspension due to its smooth outer surface, which facilitates the automatic adjustment of the position of the spherical LED chip 100 to the mounting position at the back plate 200.

As shown in FIG. 3 and FIG. 4, the back plate 200 defines multiple grooves 230. The multiple grooves 230 are hemispherical grooves. Each of the multiple grooves 230 is configured to accommodate one spherical LED chip 100. The groove 230 may also be a one-third spherical groove or other arc-shaped grooves for positioning spherical LED chips 100. In this way, each spherical LED chip 100 can be fixed in one groove 230. On the one hand, the spherical LED chip 100 can be accurately positioned on the back plate 200, on the other hand, the spherical LED chip 100 can be fixed more firmly. The first metal pad 210 and the second metal pad 220 are both in the groove 230. The first metal pad 210 is in contact with the first electrode 110 of the spherical LED chip 100 at the bottom of the groove 230. The second metal pad 220 is in contact with the second electrode 120 of the spherical LED chip 100 on one side of the groove 230. This facilitates direct communication with the spherical LED chip 100.

Since pixels have three different colors of R, G, and B, there are three different colors of LED chips 100. The second electrode 120 of the LED chip 100 is set to be of different patterns, such as the ring pattern mentioned above, according to different colors of pixels. The second metal pad 220 is set to be of a pattern, such as the ring pattern, matched with the second electrode 120. For example, the orthographic projection of the second electrode 120 of a spherical LED chip 100 representing red (R) on a plane perpendicular to the central axis where the first electrode 110 is located is a quadrilateral ring. The orthographic projection of the second electrode 120 of a spherical LED chip 100 representing green (G) on the plane perpendicular to the central axis where the first electrode 110 is located is a triangular ring. The orthographic projection of the second electrode 120 of a spherical LED chip 100 representing blue (B) on the plane perpendicular to the central axis where the first electrode 110 is located is a circular ring. The second electrodes 120 of the spherical LED chips 100 of three different colors of R, G, and B are set to be of different patterns. The second metal pads 220 on the back plate 200 configured to install the spherical LED chips of three different colors of R, G, and B on grooves 230 are set to be of corresponding patterns. The second electrodes 120 of the spherical LED chips 100 of three different colors of R, G, and B are of three different patterns, and the overlap between the different patterns is small, and thus the adsorption force therebetween is also small. Therefore, during assembly and transfer via suspension, when a mismatch occurs, a mismatched spherical LED chip 100 can be separated from the back plate 200 by vibration and re-adsorbed, thereby improving the yield.

Since there are spherical LED chips 100 of three different colors, to facilitate transfer, the spherical LED chips 100 of three different colors of R, G, and B can be of different sizes, and the back plate 200 defines grooves 230 corresponding to the sizes of the spherical LED chips 100 of three different colors of R, G, and B. During assembly and transfer via suspension, the spherical LED chips 100 of three different colors of R, G, and B are of different sizes, and the transfer starts from the largest spherical LED chip 100. For example, the largest red spherical LED chip 100 is transferred first, then the second largest green spherical LED chip 100, and then the smallest blue spherical LED chip 100. The sizes of the spherical LED chips 100 of three different colors of R, G, and B can be set in various ways.

According to the solution of the present application, the LED chip has a spherical structure, so the back plate 200 can define a hemispherical groove 230 corresponding to the size of the spherical LED chip 100, which facilitates the transfer of the spherical LED chip 100 onto the back plate 200 through mass transfer such as fluid assembly. In addition, the second electrodes of the spherical LED chips 100 are designed as magnetic electrodes of different patterns, which permits precise alignment during the transfer of LED chips, thereby improving the transfer yield.

Figure 16:
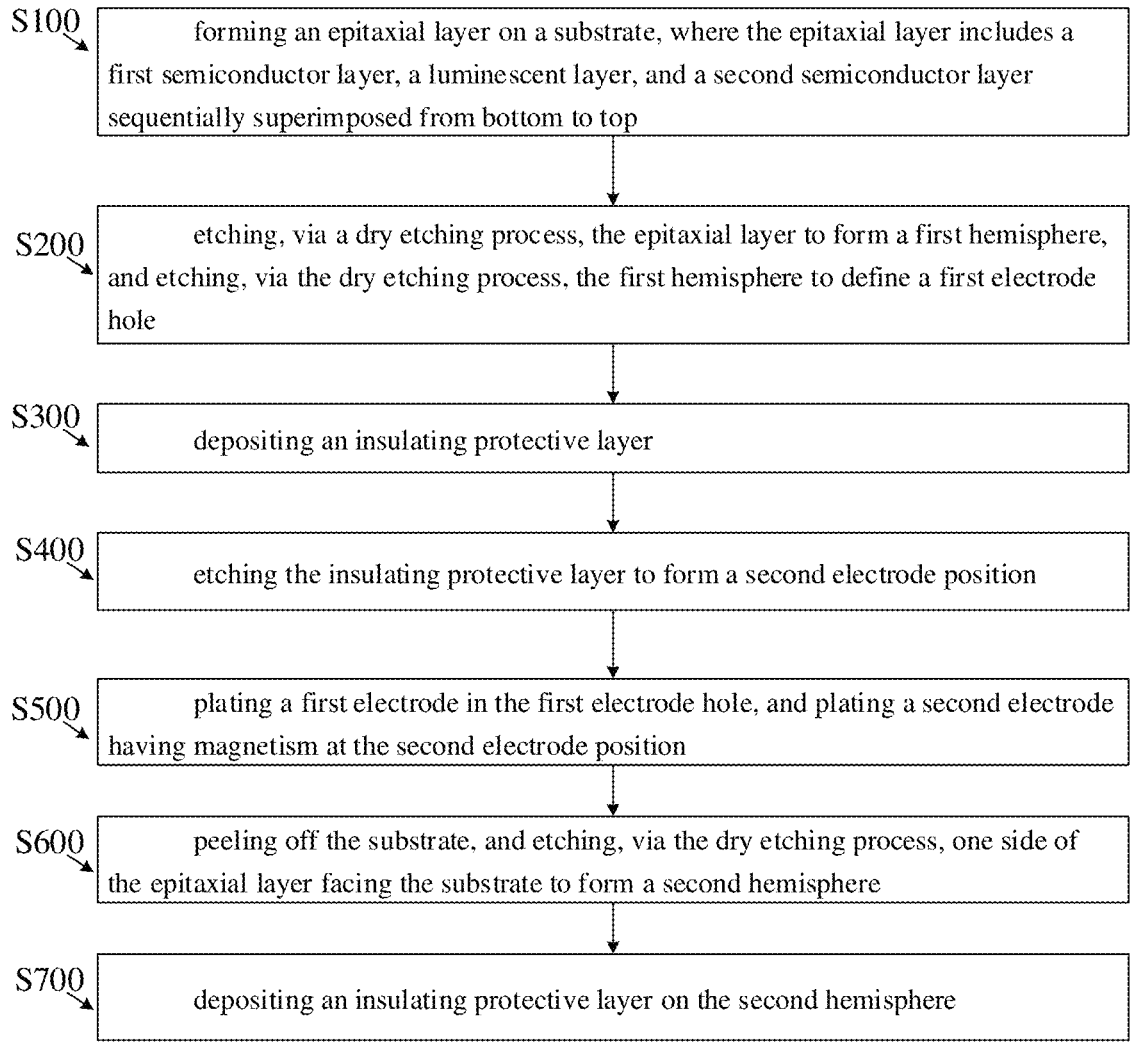
FIG. 16 is a flow chart of a method for manufacturing a spherical light-emitting diode (LED) chip according to the present application.

The solution also provides a method for manufacturing a spherical LED chip, as shown in FIG. 16, which includes the following steps.

At S100, an epitaxial layer is formed on a substrate, where the epitaxial layer includes a first semiconductor layer, a luminescent layer, and a second semiconductor layer sequentially superimposed from bottom to top.

Figure 5:
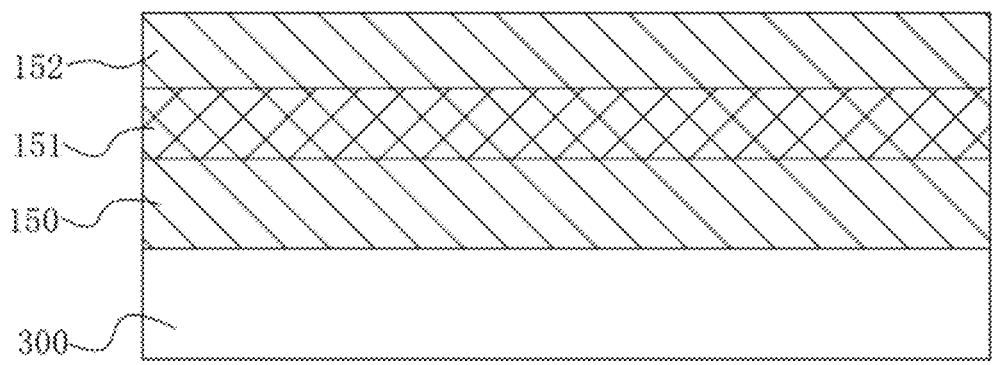
FIG. 5 is a structural diagram of a spherical LED chip after S100 in a method for manufacturing a spherical LED chip is completed according to the present application.

As shown in FIG. 5, the substrate 300 is located at the lowermost layer and an epitaxial layer is disposed on the substrate 300. The epitaxial layer includes a first semiconductor layer 150, a luminescent layer 151, and a second semiconductor layer 152 sequentially superimposed on the substrate 300 from bottom to top. As such, a four-layer structure is formed.

At S200, the epitaxial layer is etched via a dry etching process to form a first hemisphere, and the first hemisphere is etched via the dry etching process to define a first electrode hole.

Figure 6:
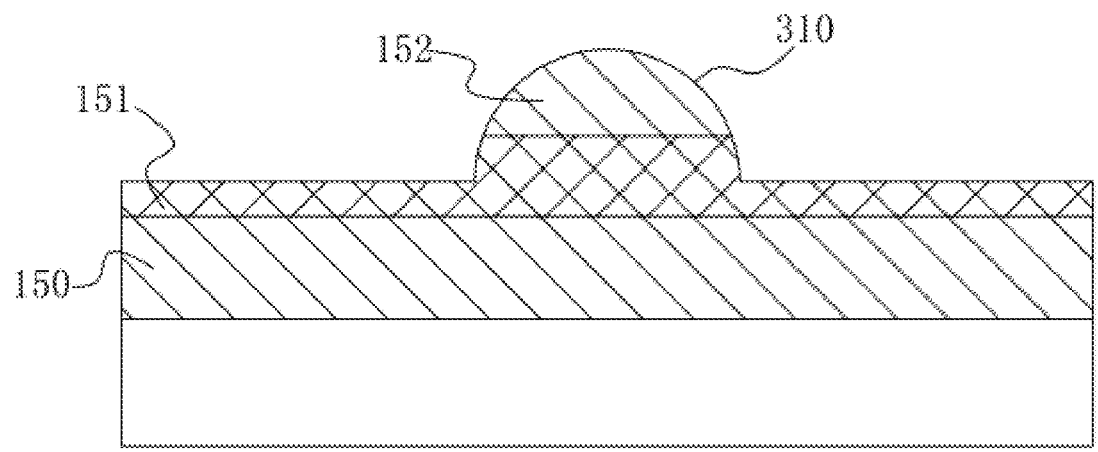
FIG. 6 is a structural diagram of a spherical LED chip after a first hemisphere is etched in a method for manufacturing a spherical LED chip according to the present application.
Figure 7:
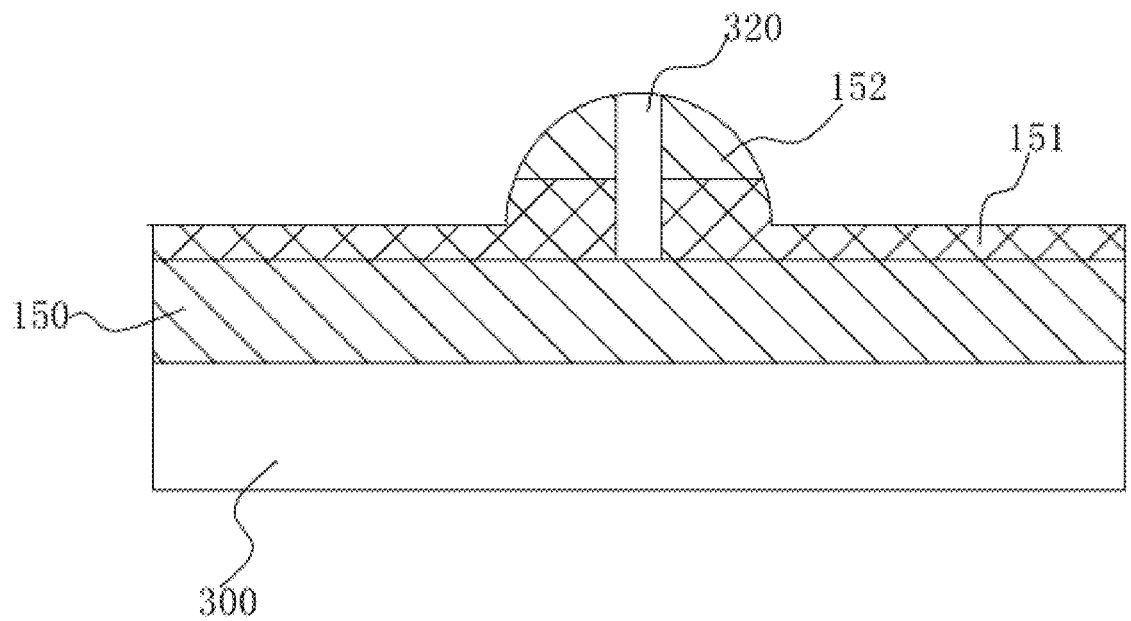
FIG. 7 is a structural diagram of a spherical LED chip after S200 in a method for manufacturing a spherical LED chip is completed according to the present application.

As shown in FIG. 6 and FIG. 7, the first hemisphere 310 includes the second semiconductor layer 152 and a part of the luminescent layer 151. The first hemisphere is etched at the top to define the first electrode hole 320.

At S300, the insulating protective layer is deposited.

Figure 8:
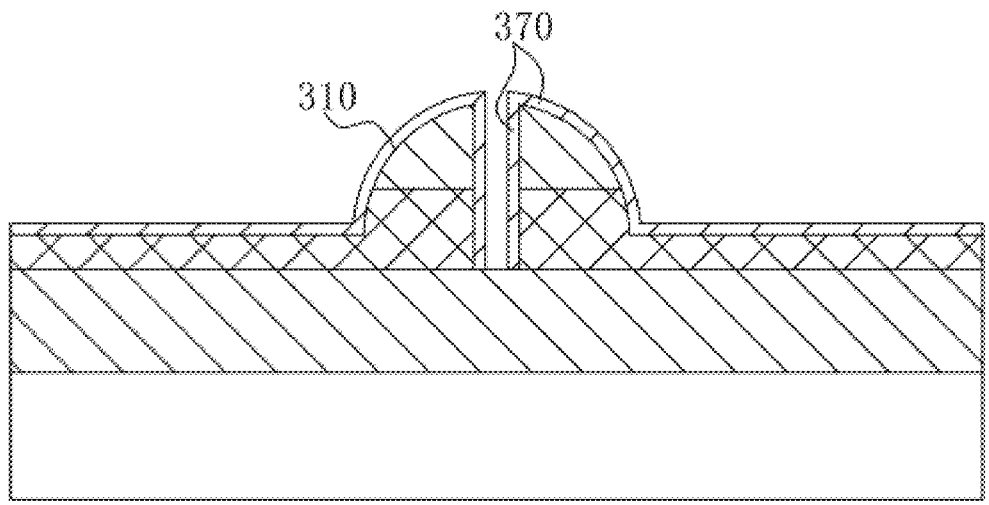
FIG. 8 is a structural diagram of a spherical LED chip after S300 in a method for manufacturing a spherical LED chip is completed according to the present application.

As shown in FIG. 8, the insulating protective layer 370 covers the outer surface of the first hemisphere 310 and the inner wall of the first electrode hole 320.

At S400, the insulating protective layer is etched to form the second electrode position.

Figure 9:
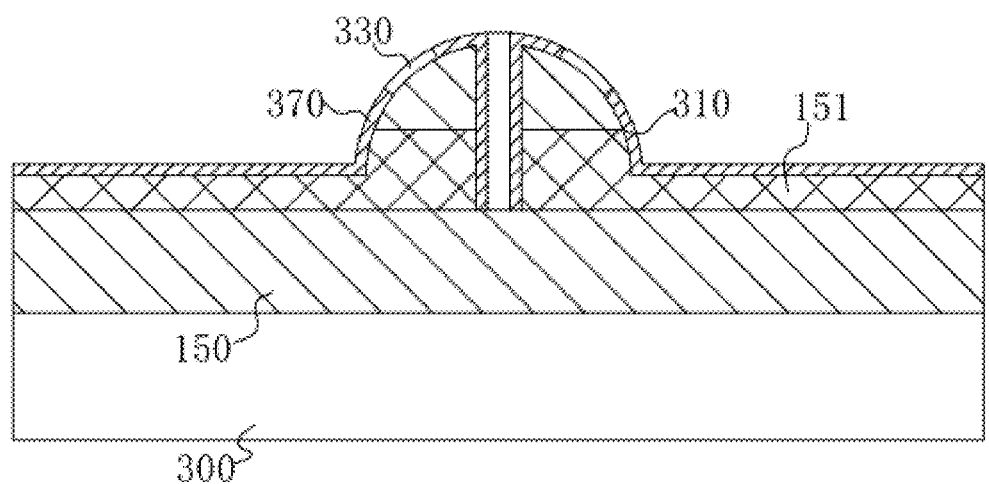
FIG. 9 is a structural diagram of a spherical LED chip after S400 in a method for manufacturing a spherical LED chip is completed according to the present application.

As shown in FIG. 9, the first hemisphere 310 is etched at the lower end of the outer surface thereof to form the second electrode position 330.

At S500, a first electrode is plated in the first electrode hole, and a second electrode having magnetism is plated at the second electrode position.

Figure 10:
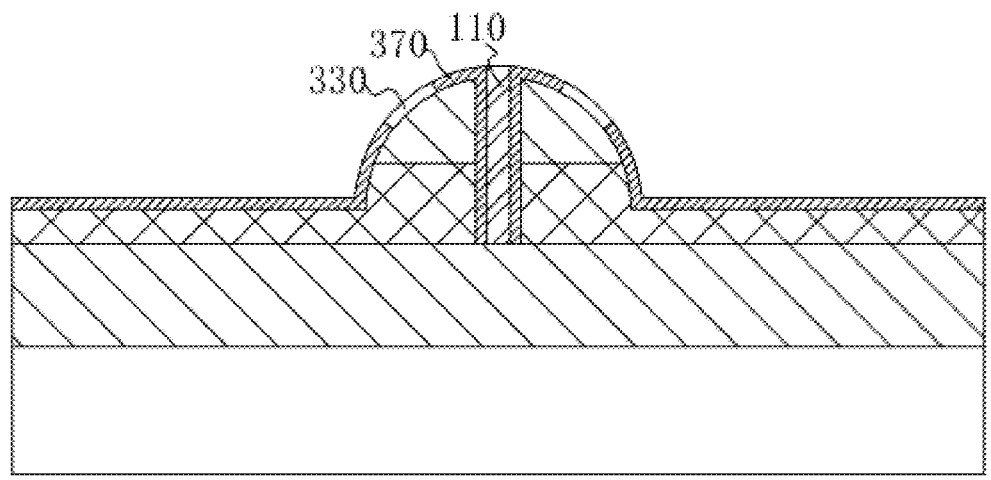
FIG. 10 is a structural diagram of a spherical LED chip after a first electrode is plated in a method for manufacturing a spherical LED chip according to the present application.
Figure 11:
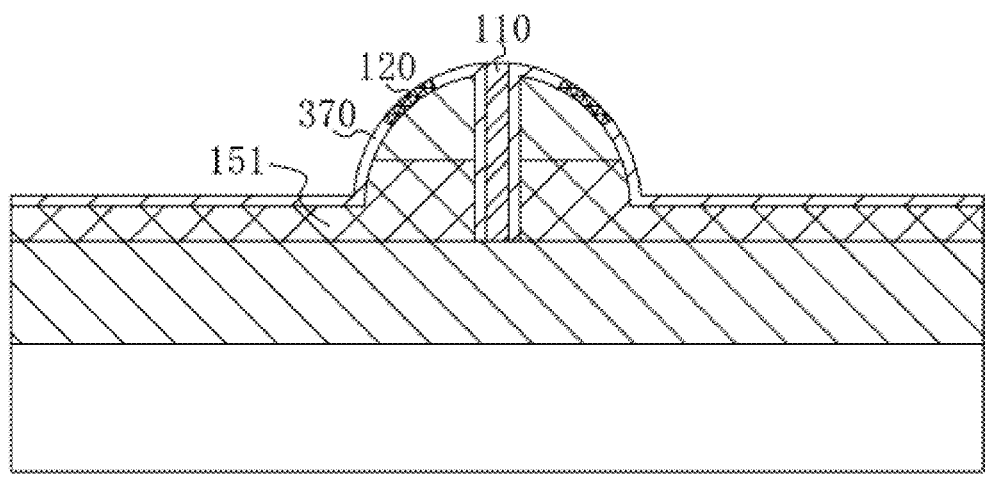
FIG. 11 is a structural diagram of a spherical LED chip after S500 in a method for manufacturing a spherical LED chip is completed according to the present application.

As shown in FIG. 10 and FIG. 11, the first electrode 110 is plated in the first electrode hole 320, and the second electrode 120 having magnetism is plated at the second electrode position 330.

At S600, the substrate is peeled off, and one side of the epitaxial layer facing the substrate is etched via the dry etching process to form a second hemisphere.

Figure 12:
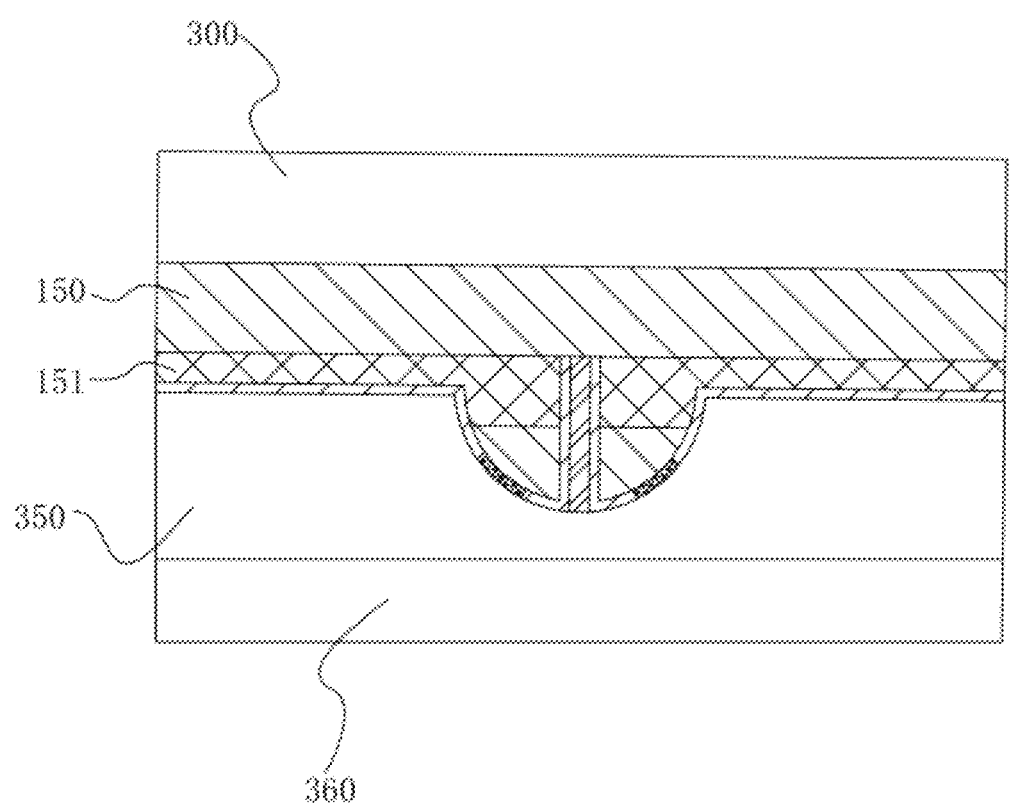
FIG. 12 is a structural diagram of a spherical LED chip after bonding in S600 in a method for manufacturing a spherical LED chip is completed according to the present application.
Figure 13:
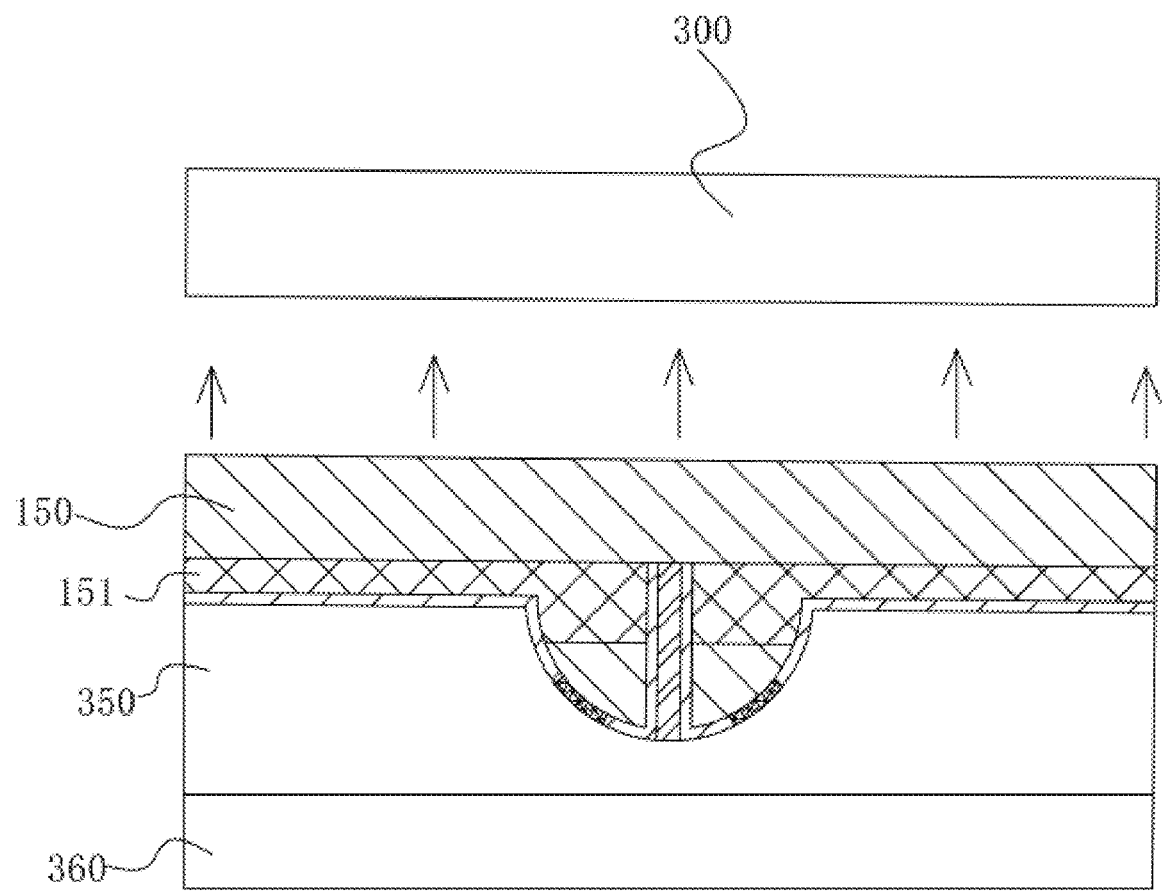
FIG. 13 is a structural diagram of a spherical LED chip after a substrate is peeled off in S600 in a method for manufacturing a spherical LED chip according to the present application.
Figure 14:
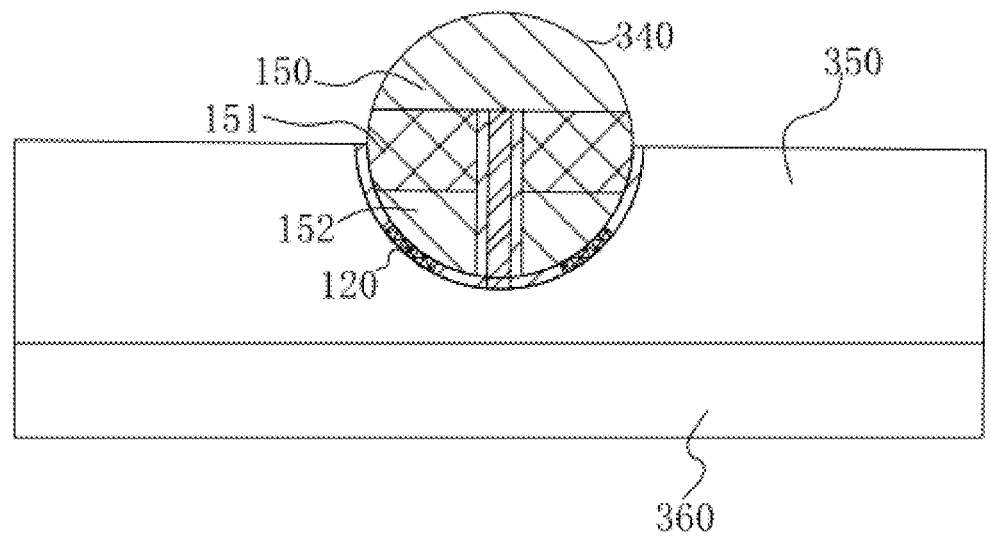
FIG. 14 is a structural diagram of a spherical LED chip after S600 in a method for manufacturing a spherical LED chip is completed according to the present application.
Figure 15:
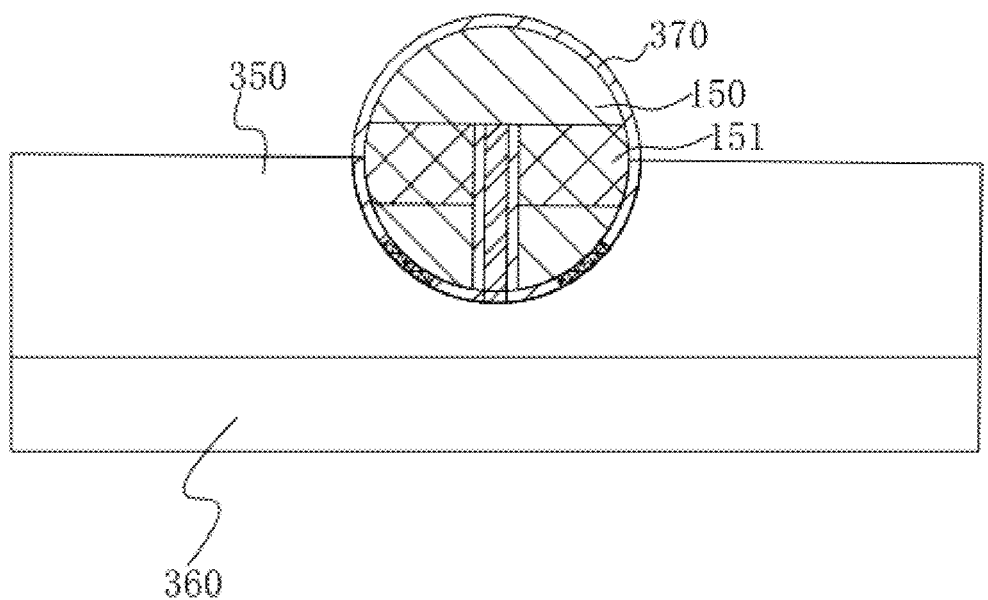
FIG. 15 is a structural diagram of a spherical LED chip after S700 in a method for manufacturing a spherical LED chip is completed according to the present application.

As shown in FIG. 12, FIG. 13, and FIG. 14, the first semiconductor layer 150 with the substrate, the luminescent layer 151, and the first hemisphere 310 formed are transferred onto a bonding substrate 360 via the bonding material 350, in which the first hemisphere 310 faces downward. Then, the substrate 300 is peeled off to expose the first semiconductor layer 150. The epitaxial layer is etched, via the dry etching process, on one side facing the substrate 300 to form the second hemisphere 340, to expose the first semiconductor layer 150 and another part of the luminescent layer 151.

At S700, an insulating protective layer is deposited on the second hemisphere.

Figure 17:
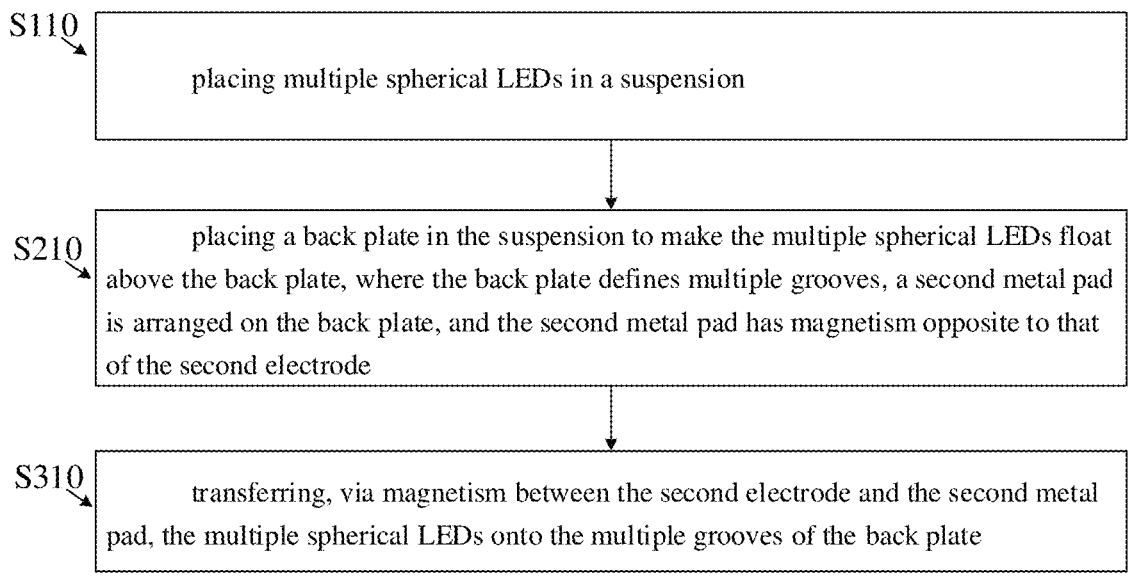
FIG. 17 is a flow chart of a method for spherical LED chip transfer according to the present application.

The solution also provides a method for spherical light-emitting diode (LED) chip transfer, as shown in FIG. 17, which includes the following steps.

At S110, multiple spherical LEDs are placed in a suspension, where each of the multiple spherical LEDs includes a first electrode, a second electrode surrounding the first electrode and having magnetism, and a first insulating protective layer arranged at the outside of the first electrode, where the first insulating protective layer and the second electrode form an LED housing configured to wrap the first electrode and with a spherical outer contour.

At S210, a back plate is placed in the suspension to make the multiple spherical LEDs float above the back plate, where the back plate defines multiple grooves, a second metal pad is arranged on the back plate, and the second metal pad has magnetism opposite to that of the second electrode.

At S310, the multiple spherical LEDs are transferred, via magnetism between the second electrode and the second metal pad, onto the multiple grooves of the back plate.

It should be understood that the order of S110 and S210 is not limited herein.

In summary, compared with the related art, according to the spherical LED chip, the first insulating protective layer and the second electrode of the LED chip form the spherical LED housing. The spherical LED housing is configured to wrap the first electrode, and separate the first electrode from the second electrode, thus realizing the power supply of the LED chip. The LED chip is set to be spherical, so the light-emitting surface thereof will be a spherical surface. The spherical LED housing as the light-emitting surface helps to reduce the total reflection inside the LED chip, thereby improving a light extraction efficiency. A hemispherical groove corresponding to the size of the spherical LED chip can be defined on the back plate. When the LED chip is transferred to the back plate via mass transfer such as fluid assembly, the spherical LED housing is accurately positioned on the mounting position at the substrate via attractive magnetism of the second electrode. The spherical LED chip instead of a cuboid or cylindrical LED chip allows for smooth position adjustment, thus realizing accurate massive transfer. The second electrodes of LED chips of different colors are designed as magnetic electrodes of different patterns, which permits the second electrodes to be in precise alignment with corresponding positions at the back plate during transfer, thereby improving the transfer yield.

What is claimed is:

1. A spherical light-emitting diode (LED) chip, comprising:
   a first electrode;
   a second electrode surrounding the first electrode and having magnetism; and
   a first insulating protective layer arranged at the outside of the first electrode, wherein
   the first insulating protective layer and the second electrode form an LED housing configured to wrap the first electrode and with a spherical outer contour.

2. The spherical LED chip of claim 1, wherein the first electrode is arranged along the central axis of the spherical outer contour, and a second insulating protective layer is arranged between the first electrode and the second electrode.

3. The spherical LED chip of claim 2, wherein the orthographic projection of the second electrode on a plane perpendicular to the central axis where the first electrode is located is a ring.

4. The spherical LED chip of claim 3, wherein the ring is a polygonal ring or a circular ring.

5. The spherical LED chip of claim 2, further comprising a first semiconductor layer, a luminescent layer, and a second semiconductor layer sequentially located in a cavity of the LED housing, wherein the first semiconductor layer is in contact with the first electrode, and the second semiconductor layer is in contact with the second electrode.

6. The spherical LED chip of claim 5, wherein the second insulating protective layer is extended between the first electrode and the luminescent layer and between the first electrode and the second semiconductor layer.

7. A display panel, comprising:
   a back plate;
   a plurality of spherical light-emitting diode (LED) chips arranged on the back plate, each of the plurality of spherical LED chips comprising:
      a first electrode;
      a second electrode surrounding the first electrode and having magnetism; and
      a first insulating protective layer arranged at the outside of the first electrode, wherein the first insulating protective layer and the second electrode form an LED housing configured to wrap the first electrode and with a spherical outer contour;
   a first metal pad arranged in the back plate and configured to be connected with the first electrode; and
   a second metal pad arranged in the back plate and configured to be connected with the second electrode, wherein the second metal pad has magnetism opposite to that of the second electrode.

8. The display panel of claim 7, wherein the first electrode is arranged along the central axis of the spherical outer contour, and a second insulating protective layer is arranged between the first electrode and the second electrode.

9. The display panel of claim 8, wherein the orthographic projection of the second electrode on a plane perpendicular to the central axis where the first electrode is located is a ring.

10. The display panel of claim 9, wherein the ring is a polygonal ring or a circular ring.

11. The display panel of claim 8, further comprising a first semiconductor layer, a luminescent layer, and a second semiconductor layer sequentially located in a cavity of the LED housing, wherein the first semiconductor layer is in contact with the first electrode, and the second semiconductor layer is in contact with the second electrode.

12. The display panel of claim 11, wherein the second insulating protective layer is extended between the first electrode and the luminescent layer and between the first electrode and the second semiconductor layer.

13. The display panel of claim 7, wherein the back plate defines a plurality of grooves, wherein each of the plurality of grooves is configured to accommodate one of the spherical LED chips.

14. The display panel of claim 7, wherein the second electrode is set to be of different patterns according to different colors of pixels, and the second metal pad is set to be of a pattern matched with the second electrode.

15. A method for spherical light-emitting diode (LED) chip transfer, comprising:
   placing a plurality of spherical LEDs in a suspension, wherein each of the plurality of spherical LEDs comprises:
      a first electrode;
      a second electrode surrounding the first electrode and having magnetism; and
      a first insulating protective layer arranged at the outside of the first electrode, wherein
      the first insulating protective layer and the second electrode form an LED housing configured to wrap the first electrode and with a spherical outer contour;
   placing a back plate in the suspension to make the plurality of spherical LEDs float above the back plate, wherein the back plate defines a plurality of grooves, a second metal pad is arranged on the back plate, and the second metal pad has magnetism opposite to that of the second electrode; and
   transferring, via magnetism between the second electrode and the second metal pad, the plurality of spherical LEDs onto the plurality of grooves of the back plate.

* * * * *